US009143135B2

United States Patent
Kouyama

(10) Patent No.: US 9,143,135 B2
(45) Date of Patent: Sep. 22, 2015

(54) FRACTIONAL FREQUENCY DIVIDER CIRCUIT

(71) Applicant: Kunihiko Kouyama, Kanagawa (JP)

(72) Inventor: Kunihiko Kouyama, Kanagawa (JP)

( * ) Notice: Subject to any disclaimer, the term of this patent is extended or adjusted under 35 U.S.C. 154(b) by 18 days.

(21) Appl. No.: 14/217,654

(22) Filed: Mar. 18, 2014

(65) Prior Publication Data

US 2015/0015311 A1 Jan. 15, 2015

(30) Foreign Application Priority Data

Jul. 12, 2013 (JP) .................................. 2013-158244

(51) Int. Cl.
*H03K 21/00* (2006.01)
*H03K 23/68* (2006.01)
*H03K 21/10* (2006.01)

(52) U.S. Cl.
CPC ................ *H03K 23/68* (2013.01); *H03K 21/10* (2013.01)

(58) Field of Classification Search
CPC ......... H03K 23/68; H03K 23/667; G06F 7/68
USPC .............. 327/115, 113, 117, 118; 377/47–49; 348/515
See application file for complete search history.

(56) References Cited

U.S. PATENT DOCUMENTS

| 5,714,896 | A | 2/1998 | Nakagawa et al. |
| 8,558,575 | B1 * | 10/2013 | Abernethy ...................... 326/52 |
| 2006/0133555 | A1 | 6/2006 | Tsukamoto et al. |
| 2009/0268091 | A1 * | 10/2009 | Kouyama ..................... 348/515 |

FOREIGN PATENT DOCUMENTS

| JP | 54-025658 | 2/1979 |
| JP | 02-096429 | 4/1990 |
| JP | 02-271717 | 11/1990 |
| JP | 03-155219 | 7/1991 |
| JP | 04-083425 | 3/1992 |
| JP | 08-242165 | 9/1996 |
| JP | 11-098007 | 4/1999 |
| JP | 2006-174197 | 6/2006 |
| JP | 2009-267651 | 11/2009 |

* cited by examiner

*Primary Examiner* — Lincoln Donovan
*Assistant Examiner* — Thomas Skibinski
(74) *Attorney, Agent, or Firm* — Rankin, Hill & Clark LLP

(57) ABSTRACT

A fractional frequency divider circuit includes: a frequency divider circuit configured to frequency-divide an input clock at 1/CTSquo, wherein the CTSquo is a quotient of CTS/N; a clock addition circuit configured to add one clock to an output of the frequency divider circuit; a counter that counts the number of cycles of the output of the frequency divider circuit by a carry of the frequency divider circuit or an output of the clock addition circuit; a match detection circuit that determines whether an integer multiple of N/CTSrem matches a value of the counter, wherein the CTSrem is a remainder of CTS/N; and a selector circuit that outputs the output of the clock addition circuit as an output clock when the match is detected by the match detection circuit, and outputs the output of the frequency divider circuit as an output clock when the match is not detected.

5 Claims, 14 Drawing Sheets

CTS=29, N=8

FRACTIONAL FREQUENCY DIVIDER CIRCUIT

CROSS-REFERENCE TO RELATED APPLICATION

This application claims priority from Japanese Patent Application No. 2013-158244 filed with the Japan Patent Office on Jul. 12, 2013, the entire content of which is hereby incorporated by reference.

BACKGROUND

1. Technical Field

The present disclosure relates to fractional frequency divider circuits. More specifically, the present disclosure relates to a fractional frequency divider circuit used in a clock generation circuit that generates a clock frequency represented by at fractional ratio relative to a source oscillation clock by using a digital frequency divider.

2. Related Art

In recent years, High-Definition Multimedia Interface (HDMI) has been known as the standard specification for the digital video and audio input/output interface, which is established mainly for the home electric appliances and audio visual (AV) appliances. The HDMI connects the source device (transmission (output) appliance) and a sink device (reception (input) appliance). The sink device receives parameters for reproducing the audio clock from the source device via the HDMI. That is, the parameters include a value (N), which is used as a frequency division ratio by the frequency divider circuit and a cycle time stamp value (CTS) as a value representing the cycle speed of the audio clock based on the video clock. A combination of CTS and N together with the Transition Minimized Differential Signaling (TMDS) clock represents the frequency division ratio of the audio clock. The sink device carries out the fractional frequency division using these parameters to reproduce the audio clock from the TMDS clock. Exemplary configurations of the fractional frequency divider circuit are described in Patent Literatures below.

[Patent Literature 1] JP-A-S54-025658
[Patent Literature 2] JP-A-H2-096429
[Patent Literature 3] JP-A-H2-271717
[Patent Literature 4] JP-A-H8-242165
[Patent Literature 5] JP-A-H11-098007
[Patent Literature 6] JP-A-2006-174197
[Patent Literature 7] JP-A-H3-155219
[Patent Literature 8] JP-A-H4-083425
[Patent Literature 9] JP-A-2009-267651

SUMMARY

A fractional frequency divider circuit includes: a first frequency divider circuit configured to frequency-divide an input clock at 1/CTSquo, wherein the CTSquo is a quotient of CTS/N (each of N and CTS is an integer); a clock addition circuit configured to add one clock to an output of the first frequency divider circuit; a counter that counts the number of cycles of the output of the first frequency divider circuit by a carry of the first frequency divider circuit or an output of the clock addition circuit; a match detection circuit that determines whether an integer multiple of N/CTSrem matches a value of the counter, wherein the CTSrem is a remainder of CTS/N; and a selector circuit that outputs the output of the clock addition circuit as an output clock when the match is detected by the match detection circuit, and outputs the output of the first frequency divider circuit as an output clock when the match is not detected.

DETAILED DESCRIPTION

Figure 1:
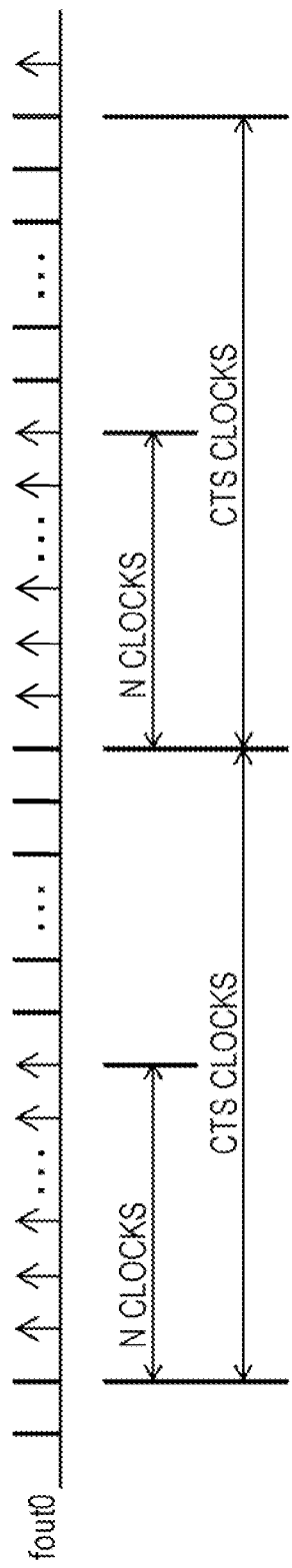
FIG. 1 is a schematic diagram illustrating an exemplary fractional frequency division by CTS and N.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a schematic diagram illustrating an exemplary fractional frequency division represented by a cycle time stamp value (CTS) and a frequency division ratio value (N). An input clock fclk and an output clock fout satisfy the relational expression of fout=fclk*N/CTS. As illustrated in FIG. 1, if N clocks are present in the period obtained by frequency-dividing fclk at 1/CTS, the average frequency of fout0 satisfies the above relational expression. In the frequency division as illustrated in FIG. 1, however, N clock edges are unevenly distributed, causing large jitter. An object of the present disclosure is to provide a fractional frequency divider circuit that can reduce the deviation of clock edges and reduce the jitter.

A fractional frequency divider circuit according to an embodiment of the present disclosure (present fractional frequency divider circuit) can output an output clock by frequency-dividing an input clock at a frequency division ratio of N/CTS (each of N and CTS is an integer). This fractional frequency divider circuit includes a first frequency divider circuit. When the quotient of CTS/N is represented by CTSquo and the remainder of CTS/N is represented by CTSrem, the first frequency divider circuit frequency-divides the input clock at 1/CTSquo. The fractional frequency divider circuit includes a clock addition circuit and a counter. The clock addition circuit adds one clock to the output of the first frequency divider circuit. The counter counts the number of cycles of the output of the first frequency divider circuit using the carry of the first frequency divider circuit or the output of the clock addition circuit. Moreover, the fractional frequency divider circuit includes a match detection circuit and a selector circuit. The match detection circuit determines whether the integer multiple of N/CTSrem matches the counter value. When the match detection circuit determines that the above two values match, the selector circuit outputs the output of the clock addition circuit as the output clock. On the other hand, when the match detection circuit determines that the above two values do not match, the selector circuit outputs the output of the first frequency divider circuit as the output clock. The present fractional frequency divider circuit may further include a second frequency divider circuit that generates CTS clocks by frequency-dividing the input clock at 1/CTS. In this case, the first frequency divider circuit uses CTSquo latched according to the CTS clocks. Further, the match detection circuit uses N and CTSrem latched according to the CTS clocks.

Next, the present fractional frequency divider circuit is described in terms of its functions. The present fractional frequency divider circuit can output the output clock fout by frequency-dividing the input clock fclk at a frequency division ratio of N/CTS (each of N and CTS is an integer). When the quotient of CTS/N is represented by CTSquo and the remainder of the CTS/N is represented by CTSrem, the present fractional frequency divider circuit latches (holds) the values of N, CTSrem, and CTSquo according to the CTS clocks obtained by frequency-dividing the input clock at 1/CTS. In other words, the present fractional frequency divider circuit counts the number of cycles of CTSquo in the CTS clocks generated by frequency-dividing the input clock fclk at 1/CTS. Next, when the count value matches the integer multiple of N/CTSrem, the present fractional frequency divider circuit outputs a clock with a cycle of CTSquo+1. On the other hand, when the values do not match, the present fractional frequency divider circuit outputs a clock with a cycle of CTSquo.

The present fractional frequency divider circuit calculates the cycle of the output clock in real time for every "cycle of input clock×cycle of CTS". Thus, the present fractional frequency divider circuit can output the output clock at any time according to the varying CTS and N.

In other words, the present fractional frequency divider circuit reduces the clock jitter of the output clock fout by suppressing a variation in cycle of the output clock fout to be less than or equal to one cycle of the input clock fclk. As a result, the calculated variation in cycle allows less deviation. Moreover, the low-frequency jitter is reduced. The cycle of the output clock fout is calculated in real time using the quotient and the remainder of CTS/N. Thus, the present fractional frequency divider circuit can operate even when CTS and N vary. Note that any value can be calculated as long as the integer N is less than or equal to the integer CTS.

The working effects of the present fractional frequency divider circuit and other objects, characteristics, aspects, and effects of the present fractional frequency divider circuit will be made more apparent from the detailed description made below with reference to the attached drawings.

A fractional frequency divider circuit (present fractional frequency divider circuit) according to an embodiment of the present disclosure is described with reference to the attached drawings.

Figure 2:
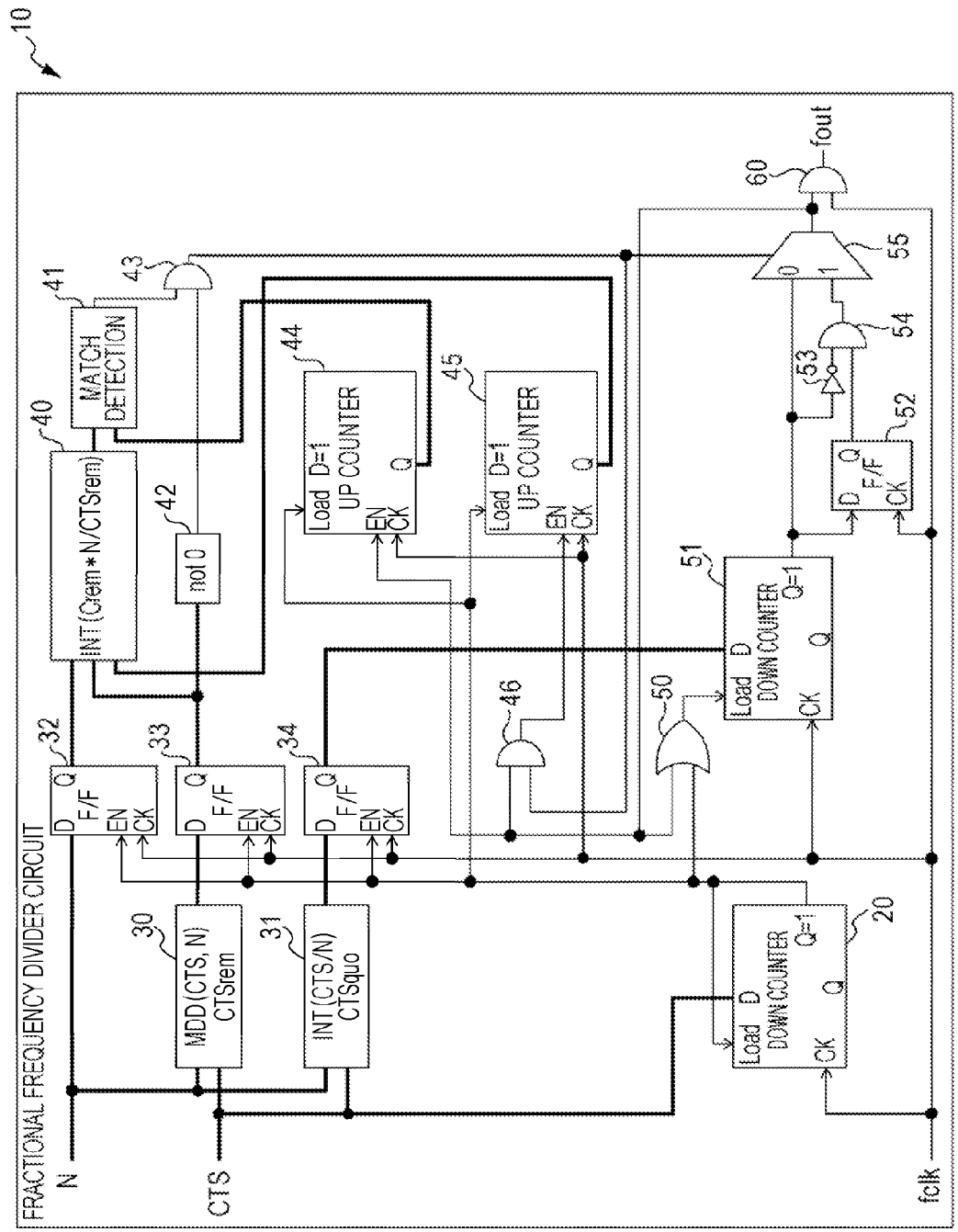
FIG. 2 is a circuit diagram illustrating an exemplary configuration of a fractional frequency divider circuit according to an embodiment of the present disclosure.

FIG. 2 is a circuit diagram illustrating a fractional frequency divider circuit 10 as an example of the present fractional frequency divider circuit. The fractional frequency divider circuit 10 includes an OR circuit 50, a down counter for CTS count (second frequency divider circuit) 20, and a down counter for fout cycle (first frequency divider circuit) 51. The fractional frequency divider circuit 10 further includes a flip-flop circuit 52, an inverter circuit 53, and an AND circuit 54, which constitute the clock addition circuit. In addition to these structural components, the fractional frequency divider circuit 10 includes a CTS remainder calculation circuit 30, a CTS quotient calculation circuit 31, an N-latch circuit 32, a CTS remainder latch circuit 33, a CTS quotient latch circuit 34, a calculation circuit for comparison of the number of fout clocks 40, a match detection circuit for the number of fout clocks (match detection circuit) 41, a non-zero detection circuit 42, an AND circuit 43, an up counter for fout clock count (counter) 44, an up counter for CTSrem count 45, an AND circuit 46, a 2:1 selector circuit 55, and an AND circuit 60.

As illustrated in FIG. 1, when the input clock fclk is frequency-divided at a frequency division ratio of N/CTS (each of N and CTS is an integer), N clocks are present in one period obtained by frequency-dividing the input clock fclk at 1/CTS. Therefore, the N/CTS frequency division can be performed using the relational expression in regard to the quotient and remainder of dividing CTS by N:

$$CTS = CTSquo * N + CTSrem$$

(where CTSquo represents the quotient of dividing CTS by N, and CTSrem is the remainder of dividing CTS by N).

Figure 3:
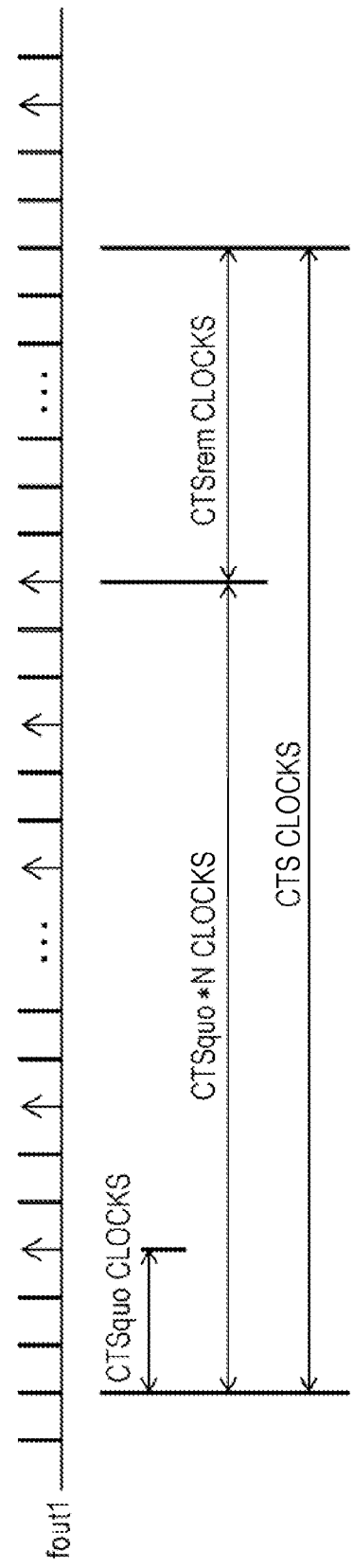
FIG. 3 is a schematic diagram illustrating an exemplary configuration of fractional frequency division utilizing the quotient and remainder of CTS/N.

FIG. 3 is a schematic diagram representing the relation between CTSquo and CTSrem. When CTS is indivisible by N, N clock edges with a cycle of CTSquo are present evenly. No clock edges are present in the CTSrem clock region. Therefore, the cycle deviates (clock edges are unevenly distributed). When CTS is divisible by N, CTSrem becomes 0 and the cycle of fout1 becomes equal to CTSquo clock. As a result, the jitter becomes 0. Therefore, when CTS is indivisible by N, the clock edges are distributed.

The distribution of the clock edges is described below. First, the CTSrem clock regions are distributed. Thus, the clock edges are disposed in CTSrem (CTSquo+1) clock cycles and (N−CTSrem) CTSquo clock cycles. By arranging the clock edges as above, the following relational expression holds:

$$CTS = CTSquo * N + CTSrem = CTSrem(CTSquo+1) + (N-CTSrem)CTSquo$$

As a result, the N/CTS frequency division is made. Here, since the number of clock edges is equal to the frequency division ratio value N, the following relation is satisfied:

$$fout = fclk * N/CTS$$

As a result, the clock jitter (variation in clock is suppressed to be less than or equal to one cycle of fclk.

Figure 4:
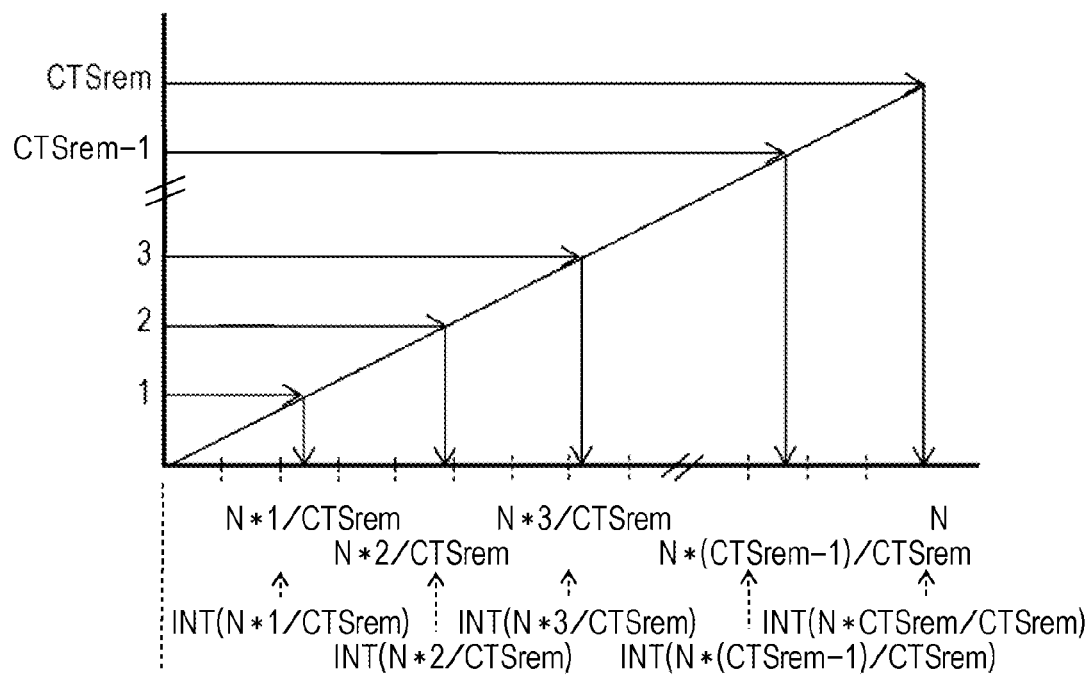
FIG. 4 is a graph illustrating the relation between the integer quotient and the rational quotient of the N/CTSrem.

Next, with reference to FIG. 4, a method of disposing the clock edges is examined. FIG. 4 is a graph illustrating the relation between the integer quotient and the rational quotient of N/CTSrem. In this graph, the vertical axis (y axis) represents the value of CTSrem and the horizontal axis (x axis) represents the value of N. The graph in the figure represents the linear function y=(CTSrem/N)x from the value obtained by multiplying N by 1/CTSrem (N*1/CTSrem) to the value obtained by multiplying N by CTSrem/CTSrem (N*CTSrem/CTSrem). With regard to this linear function, a rational solution, which is the value of x when the value of y is changed from 1 to CTSrem, corresponds to the point of intersection between the horizontal axis and the line extending vertically downward from the intersection between the line connecting (0, 0) and (N, CTSrem) and the line extending horizontally from any of 1 to CTSrem of the vertical axis. As for the quotient obtained by dividing N by CTSrem, the integer quotient in the case where the number is divisible does not match the rational quotient in the case where the number is indivisible. In FIG. 4, the integer quotient is represented by INT(N*1/CTSrem), and the rational quotient is represented by N*1/CTSrem.

In FIG. 4, each division along the horizontal axis corresponds to the CTSquo clock interval. When the count value of the N counter matches the integer quotient of CTS/N, one clock of fclk is added for distributing the clocks of CTSrem. Thus, the interval is set to CTSquo or CTSquo+1. As a result, the number of CTSquo becomes (N−CTSrem) and the number of CTSquo+1 becomes CTSrem.

Every time the N counter counts, the fclk is gated and one clock is output. In the clock to be output (fout), the number of clock edges becomes N. The clock (fout) includes (N−CTSrem) clocks with a cycle of CTSquo and CTSrem clocks with a cycle of (CTSquo+1). Therefore, fout satisfies the relation of fout=fclk*N/CTS. Thus, the clock jitter becomes less than or equal to one cycle of fclk. As a result, CTSquo and (CTSquo+1) are distributed with smaller deviation. With reference to FIG. 2 again, an example of the fractional frequency divider circuit having the architecture for realizing the distribution of the clocks as above is described.

In the fractional frequency divider circuit 10 illustrated in FIG. 2, the down counter for CTS count 20 updates the value of CTS for every CTS clock of fclk. The down counter for CTS count 20 generates a carry signal when Q=1, loads the value of CTS, and counts down. Therefore, the down counter for CTS count 20 serves as a 1/CTS frequency divider circuit (second frequency divider circuit). On this occasion, CTS does not need to be a fixed value but may vary at any time.

The N-latch circuit 32 latches the value of N every time the down counter for CTS count 20 generates the carry signal. Note that N does not need to be a fixed value but may vary at any time. The CTS remainder latch circuit 33 holds the remainder of CTS/N. In other words, the CTS remainder latch circuit 33 latches the value of the remainder of CTS/N output from the CTS remainder calculation circuit 30 every time the down counter for CTS count 20 generates the carry signal. The CTS quotient latch circuit 34 holds the quotient of CTS/N. The CTS quotient latch circuit 34 latches the value of the quotient of CTS/N output from the CTS quotient calculation circuit 31 every time the down counter for CTS count 20 generates the carry signal.

The up counter for fout clock 44 loads 1 every time the down counter for CTS count 20 generates the carry signal. The up counter for fout clock 44 counts up the count value every time the 2:1 selector circuit 55 generates 1, thereby calculating the clock number (Nnum).

The up counter for CTSrem count 45 loads 1 every time the down counter for CTS count 20 generates the carry signal. The up counter for CTSrem count 45 counts up the count value every time the 2:1 selector circuit 55 and the AND circuit 43 generate 1, thereby calculating the insertion umber of CTSrem (Crem).

The calculation circuit for comparison of the number of fout clocks 40 calculates the integer of (Crem*N/CTSrem) and outputs the calculation result. The match detection circuit 41 compares the clock number (Nnum) as the calculation result and the fout clock number comparison value. When these values have matched, the match detection circuit 41 outputs 1. If CTS is divisible by N, CTSrem=0, whereby CTSrem does not need to be distributed. Therefore, when CTRSrem=0, the non-zero detection circuit 42 outputs 0. Thus, the AND circuit 43 masks the output signal of the match detection circuit 41.

The down counter for fout cycle count 51 loads the value of the quotient of CTS/N (CTSquo) every time the down counter for CTS count 20 generates the carry signal or the 2:1 selector circuit 55 outputs 1. The down counter for fout cycle count 51 outputs 1 when the value of Q is equal to 1. The flip-flop circuit 52 shifts by one clock, the carry signal input from the down counter for fout cycle count 51. The output of the inverter circuit 53 is an inverted signal of the carry signal from the down counter for fout cycle count 51. The AND circuit 54 masks the output of the flip-flop circuit 52 when the down counter for fout cycle count 51 outputs 1 as the carry signal. At other than the above time, the AND circuit 54 outputs the output signal of the flip-flop circuit 52. In this manner, a combination of the flip-flop circuit 52, the inverter circuit 53, and the AND circuit 54 serve as the clock addition circuit that adds one clock to the clock output from the down counter for fout cycle count 51.

When the select signal of the 2:1 selector circuit 55 is 0, the carry signal of the down counter for fout cycle count 51 becomes the load signal. When the select signal is 1, the load signal is the signal obtained by shifting by one clock, the carry signal of the down counter for fout cycle count 51. Therefore, the down counter for fout cycle count 51 serves as the 1/CTSquo frequency divider circuit for frequency-dividing the input clock at 1/CTSquo when the select signal of the 2:1 selector circuit 55 is 0. On the other hand, when select signal of the 2:1 selector circuit 55 is 1, the down counter for fout cycle count 51 serves as the 1/(CTSquo+1) frequency divider circuit for frequency-dividing the input clock at 1/(CTSquo+1). In this specification, the down counter for fout cycle count 51 is also referred to as the first frequency divider circuit.

The clock number Nnum output from the up counter for fout clock 44 corresponds to the value of the integer of the horizontal axis described with reference to FIG. 4. INT (Crem*N/CTSrem), which is the output of the calculation circuit for comparison of the number of fout clocks 40, corresponds to the rational solution described with reference to FIG. 4. Therefore, when the number of clocks Nnum and INT(Crem*N/CTSrem) matches, the AND circuit 43 outputs the select signal 1. Thus, the down counter for fout cycle count 51 functions as the 1/(CTSquo+1) frequency divider circuit. When the number of clocks Nnum and INT(Crem*N/CTSrem) do not match or CTRSrem=0, the AND circuit 43 outputs the select signal 0. Thus, the down counter for fout cycle count 51 functions as the 1/CTSquo frequency divider circuit. Therefore, (N−CTSrem) clocks with a cycle of CTSquo are output. Moreover, CTSrem clocks with a cycle of CTSquo+1 are output. Additionally, the timings of outputting the clocks with a cycle of CTSquo+1 are distributed.

The AND circuit 60 masks fclk by the carry signal output from the 2:1 selector circuit 55. On this occasion, the clock edge of the clock signal output from fout satisfies the relation of fout=fclk*N/CTS. Therefore, the clock jitter becomes less than or equal to one cycle of fclk. CTSquo and (CTSquo+1) are distributed with smaller deviation.

Figure 5:
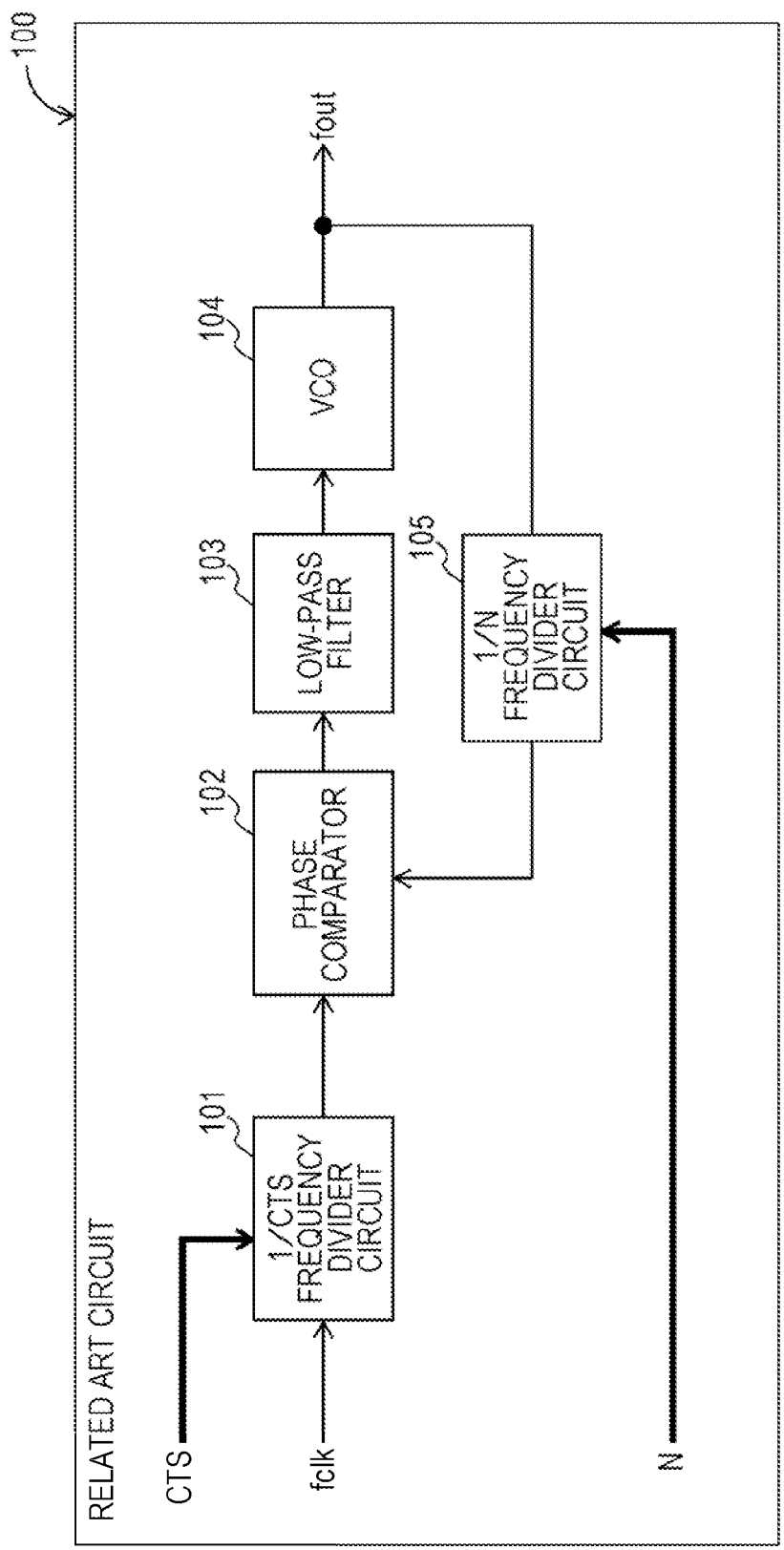
FIG. 5 is a block diagram illustrating an exemplary configuration of a related art circuit.

On the other hand, a related art circuit has a structure as illustrated in FIG. 5, for example. A related art circuit 100 includes a 1/CTS frequency divider circuit 101, a phase comparator 102, a low-pass filter 103, a VCO 104, and a 1/N frequency divider circuit 105. The frequency divider circuit 101 frequency-divides fclk at fclk1/CTS. The frequency-divided fclk is multiplied by N by a phase-locked loop (PLL) including the phase comparator 102, the low-pass filter 103, the VCO 104, and the 1/N frequency divider circuit 105. Therefore, fout=fclk*N/CTS is satisfied. The phase comparison frequency is fclk/CTS.

Figure 6:
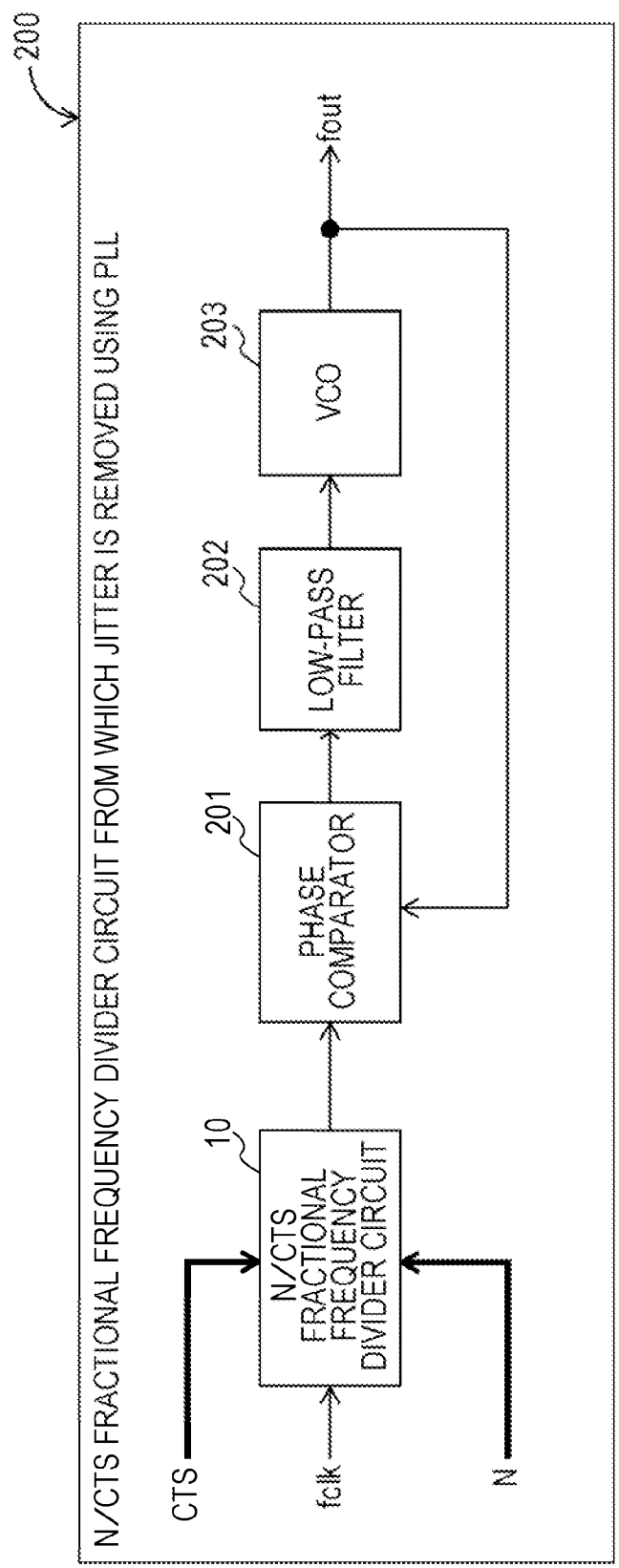
FIG. 6 is a block diagram illustrating an exemplary configuration of a fractional frequency divider circuit from which jitter is removed using PLL.

The present fractional frequency divider circuit is, as aforementioned, the N/CTS fractional frequency divider circuit that can output the output clock by frequency-dividing the input clock at N/CTS. Here, an embodiment of removing the jitter of the output signal of the N/CTS fractional frequency divider circuit using PLL is described with reference to FIG. 6. A PLL frequency divider circuit 200 includes the N/CTS fractional frequency divider circuit 10 according to this embodiment, and a PLL circuit connected to the output side of the fractional frequency divider circuit 10. The PLL circuit includes a phase comparator 201, a low-pass biter 202, and a voltage controlled oscillator (VCO) 203. The signal output from the N/CTS fractional frequency divider 10 is the combination of the clocks obtained by frequency-dividing the fclk clock at 1/(INT(CTS)/N)) or 1/(INT(CTS/N)+1. The cycle jitter is less than or equal to the cycle of one fclk clock. The above signal is input to the low-pass filter via the phase comparator 201. This removes the high-frequency phase jitter from the signal.

The phase comparison frequency used in the phase comparator 201 is the frequency of fout. Therefore, the phase comparison frequency is higher than that of the related art circuit illustrated in FIG. 5. Thus, the cutoff frequency of the low-pass filter 202 can be set high. When the cutoff frequency is equal to that of the related art circuit, more phase errors can be removed, whereby the jitter of the output clock can be reduced. With the structure as above, the capacity of a capacitor the low-pass filter becomes small. Therefore, the circuit illustrated in FIG. 6 can be mounted on a large scale integrated circuit (LSI).

Figure 7:
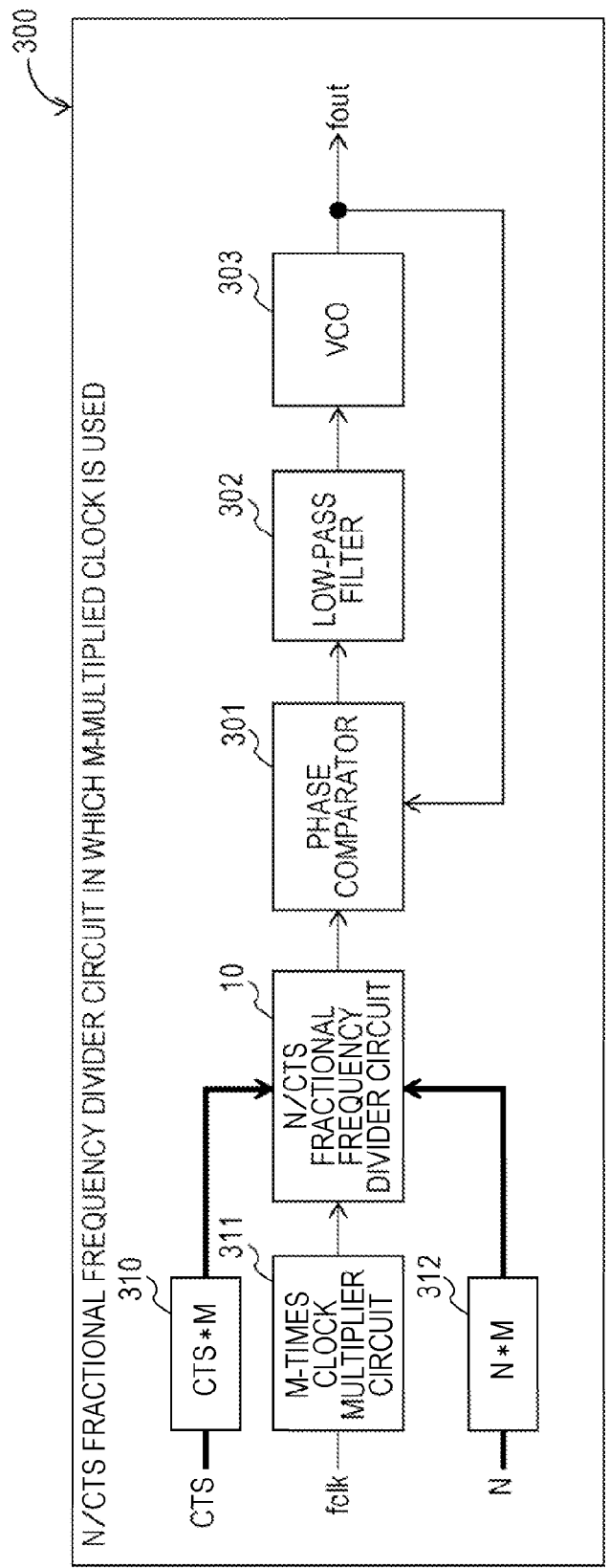
FIG. 7 is a block diagram illustrating an exemplary configuration of a fractional frequency divider circuit in which an M-multiplied clock is used.

An embodiment of the present fractional frequency divider circuit (N/CTS fractional frequency divider circuit) in which the M-multiplied clock is used is described with reference to FIG. 7. M is the multiple by which the fclk is multiplied. A PLL multiplier circuit 300 includes the N/CTS fractional frequency divider circuit 10, a CTS*M calculation circuit 310 connected to the input side of the fractional frequency divider circuit 10, a clock multiplier circuit 311, and an N*M calculation circuit 312. Moreover, the PLL multiplier circuit 300 includes a PLL circuit connected to the output side of the fractional frequency divider circuit 10. The PLL circuit includes a phase comparator 301, a low-pass filter 302, and a VCO 303. The clock multiplier circuit 311 multiples the frequency of fclk by M. The integer quotient of (CTS*M)/(N*M) is INT/((CTS*M)/(N*M))=INT(CTS/N), and is equal to one obtained when the clock is not multiplied. The cycle of the clock input to the fractional frequency divider circuit 10 is 1/M. Therefore, the variation in cycle of fout is less than or equal to one cycle of the input clock. Thus, the variation in cycle is also 1/M. Therefore, the amount of removing the phase error by the low-pass filter 302 may be small.

HDMI uses three sets of data lines and one set of clocks to transmit the signal from the source device to the sink device. The values of CTS and N are transmitted in packets. Thus, the audio clock is reproduced. At the same time as the clock signal, the values of CTS and N may be transmitted in this embodiment. Therefore, Sony Philips Digital InterFace (S/PDIF) can also reproduce the clocks while changing the frequency defined by CTS and N. In S/PDIF, one signal line is used to transmit the clock and the data information. The information on the values of CTS and N is transmitted with a user's bit. CTS and N separated on the reception side are given to the fractional frequency divider circuit. Thus, the clocks with arbitrary frequency defined by CTS and N can be reproduced.

Figure 8:
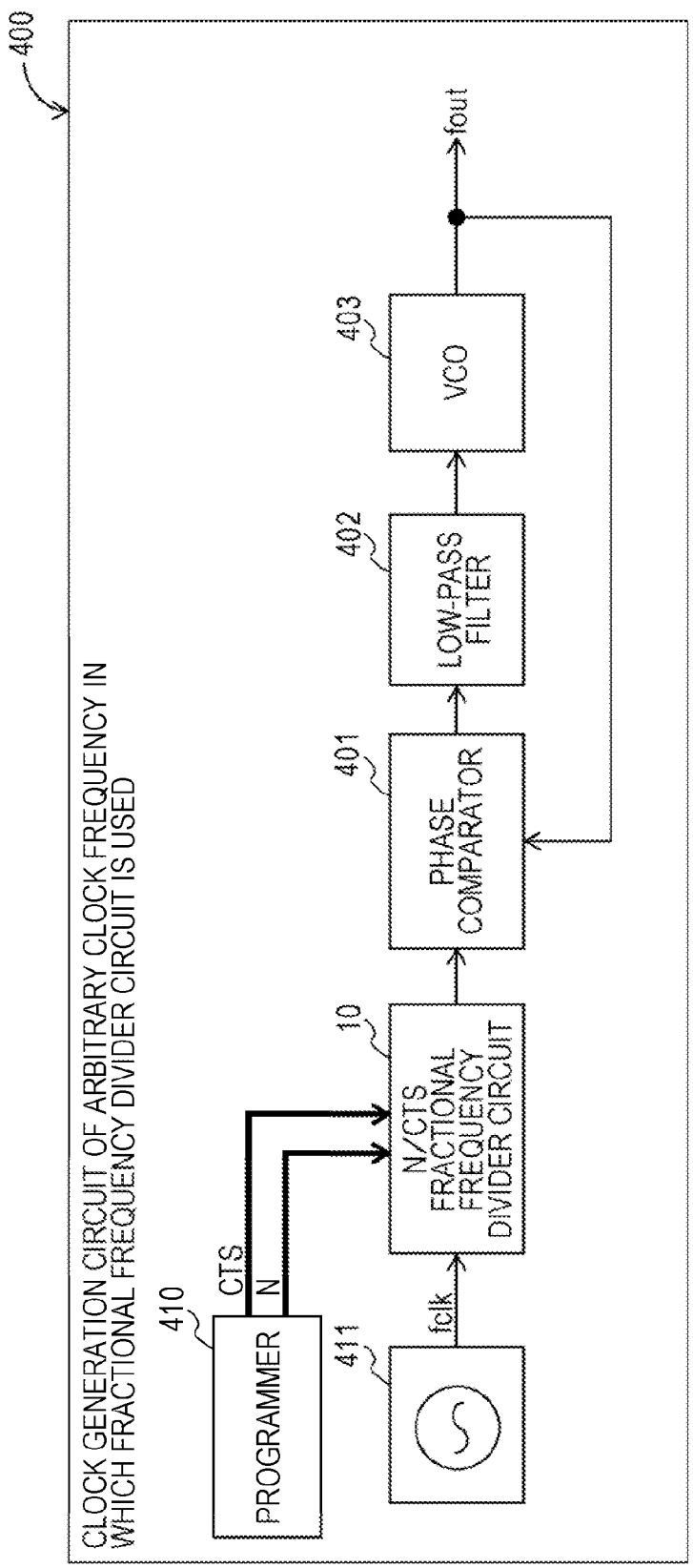
FIG. 8 is a block diagram illustrating an exemplary configuration of a clock generator of any clock frequency in which a fractional frequency divider circuit is used.

An embodiment of the clock generation circuit in which the present fractional frequency divider circuit is used is illustrated in FIG. 8. This clock generation circuit 400 generates the clocks of arbitrary clock frequency. The clock generation circuit 400 includes the N/CTS fractional frequency divider 10, a programmer 410 connected to the input side of the fractional frequency divider 10 and setting the values of CTS and N, and an oscillator 411 for supplying the reference clock to fclk. Moreover, the clock generation circuit 400 has a PLL circuit connected to the output side of the fractional frequency divider circuit 10. The PLL circuit includes a phase comparator 401, a low-pass filter 402, and a VCO 403. The fclk to be output satisfies the relation of fout=fclk*N/CTS. As a result, the frequency of the set values of arbitrary CTS and N is output. The fractional frequency divider circuit calculates in real time the cycle of the output signal of fout. Therefore, the values of CTS and N can be changed at any time.

EXAMPLE

Figure 9:
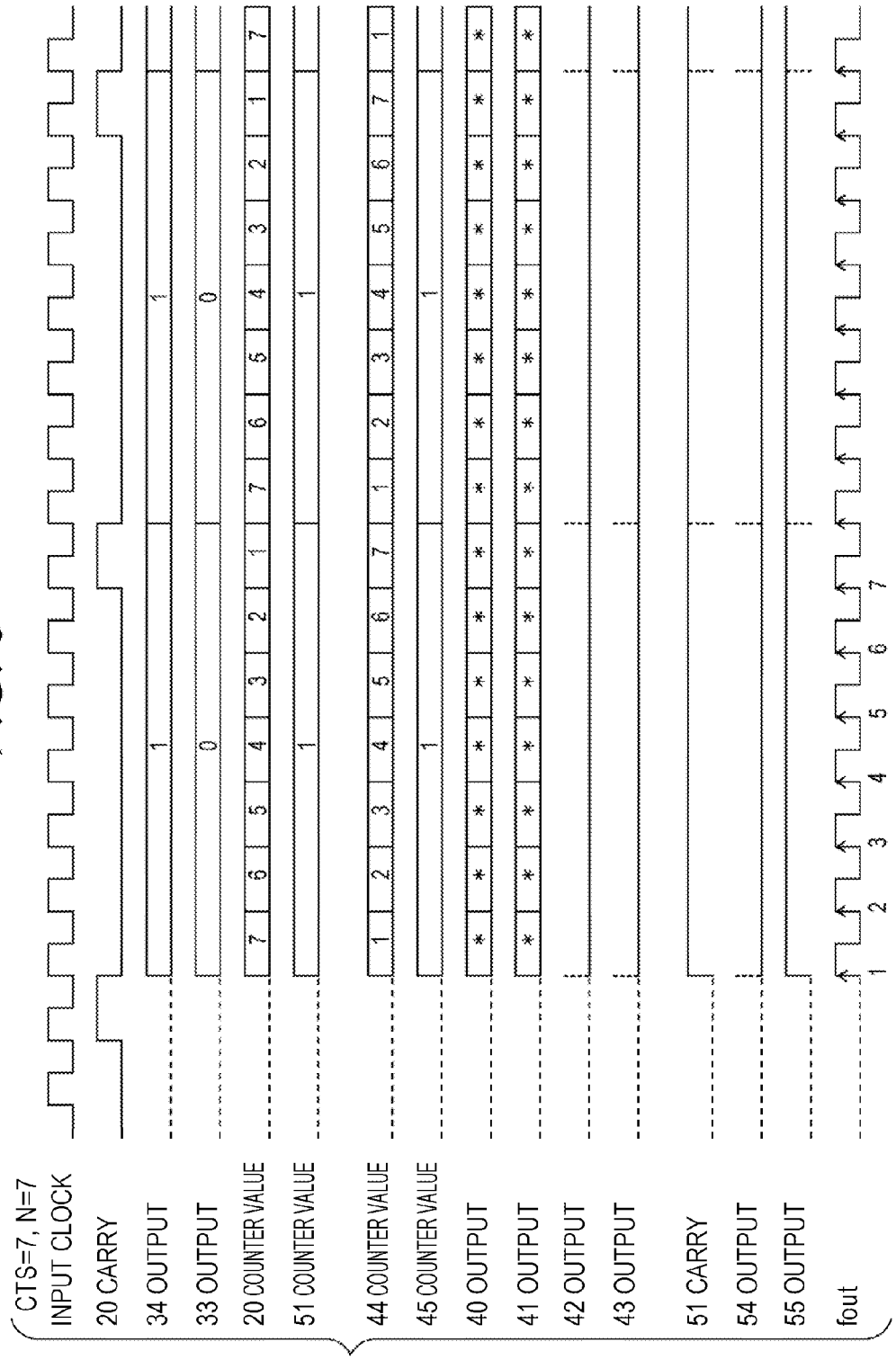
FIG. 9 is a time chart when CTS=7 and N=7.
Figure 10:
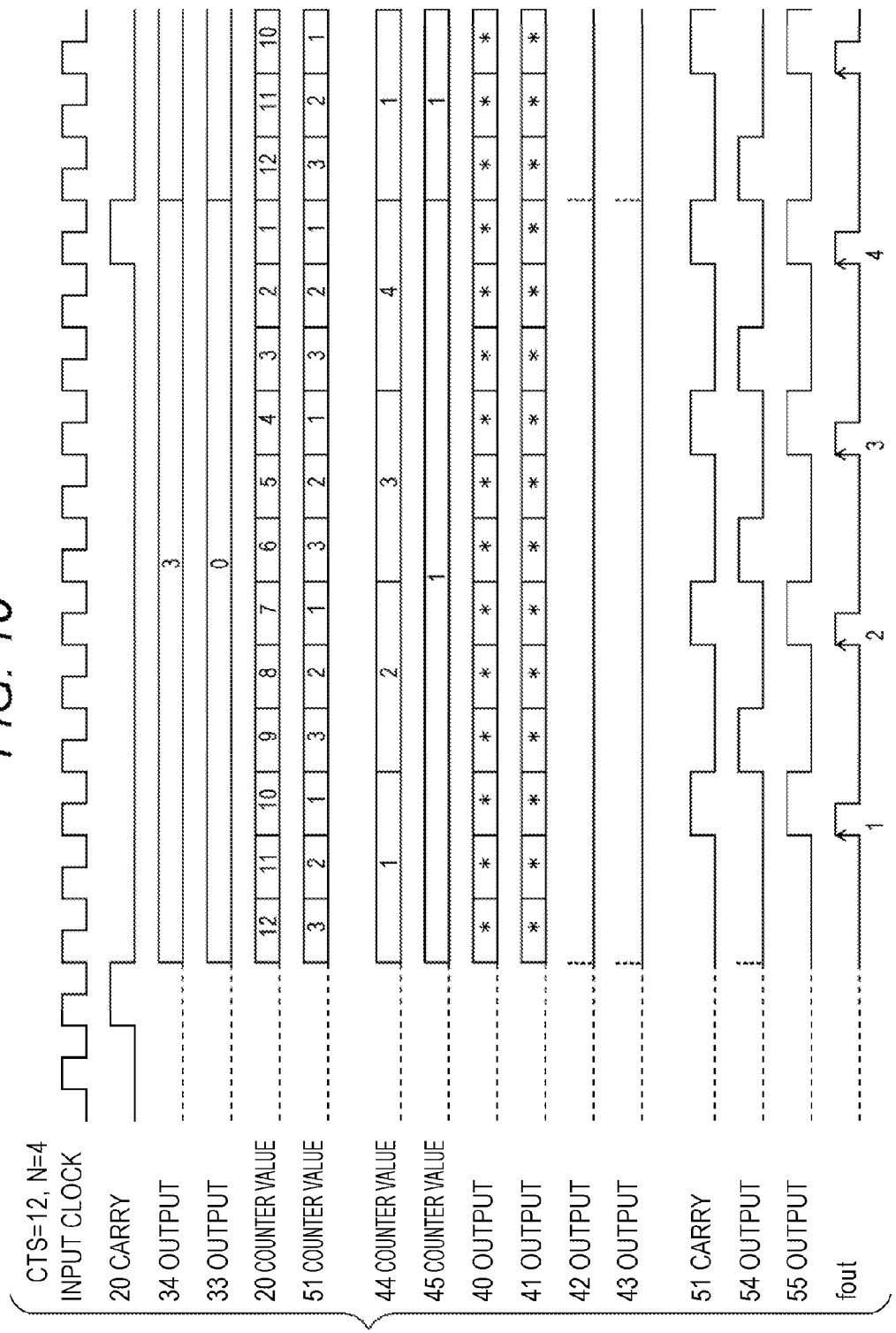
FIG. 10 is a time chart when CTS=12 and N=4 (when CTS is divisible by N)
Figure 11:
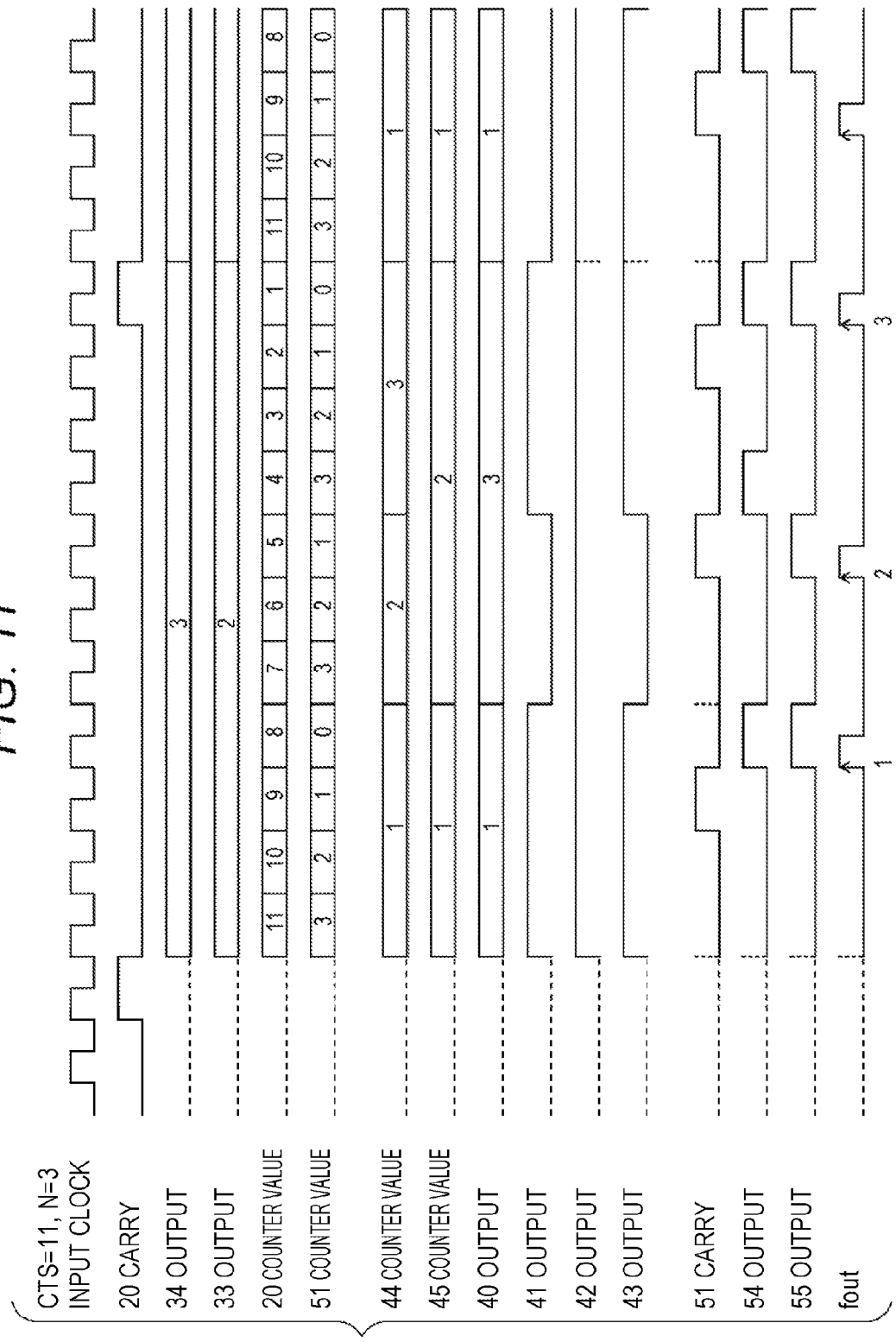
FIG. 11 is a time chart when CTS=11 and N=3 (when CTS/N leaves a remainder, and is a simple case)
Figure 12:
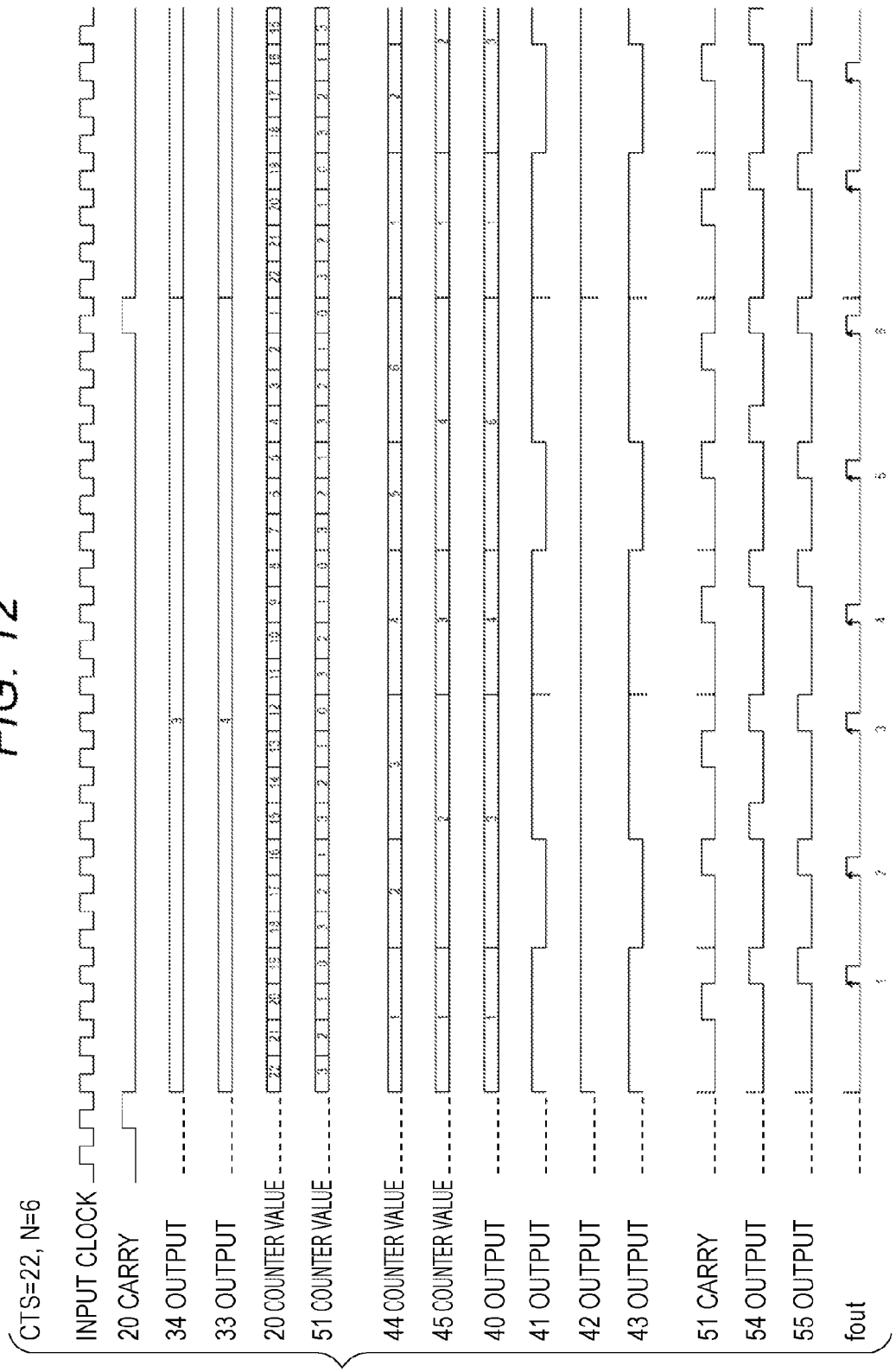
FIG. 12 is a time chart when CTS=22 and N=6 (when CTS/N leaves a remainder)
Figure 13:
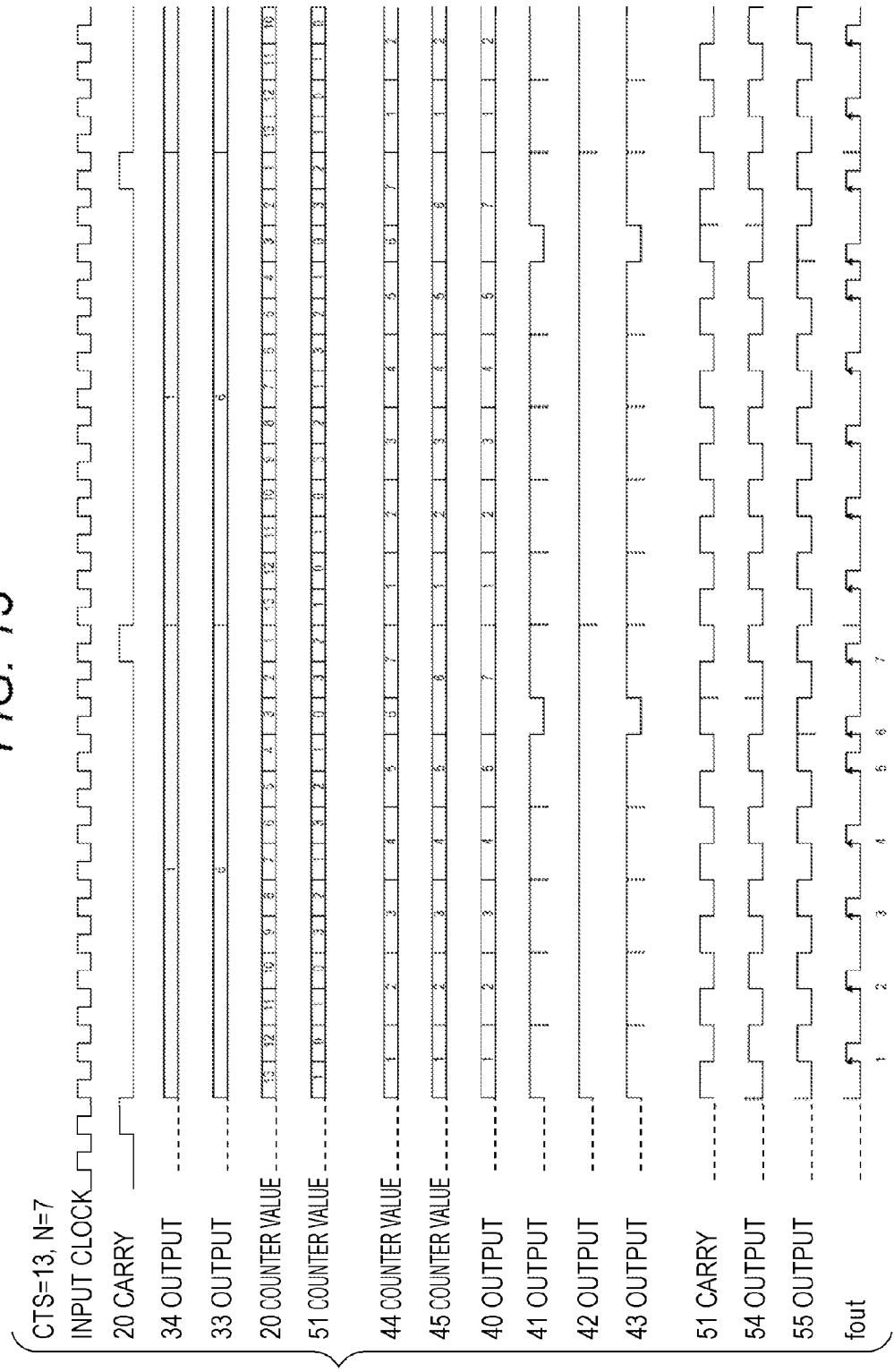
FIG. 13 is a time chart when CTS=13 and N=7 (when CTS/N leaves the maximum remainder)
Figure 14:
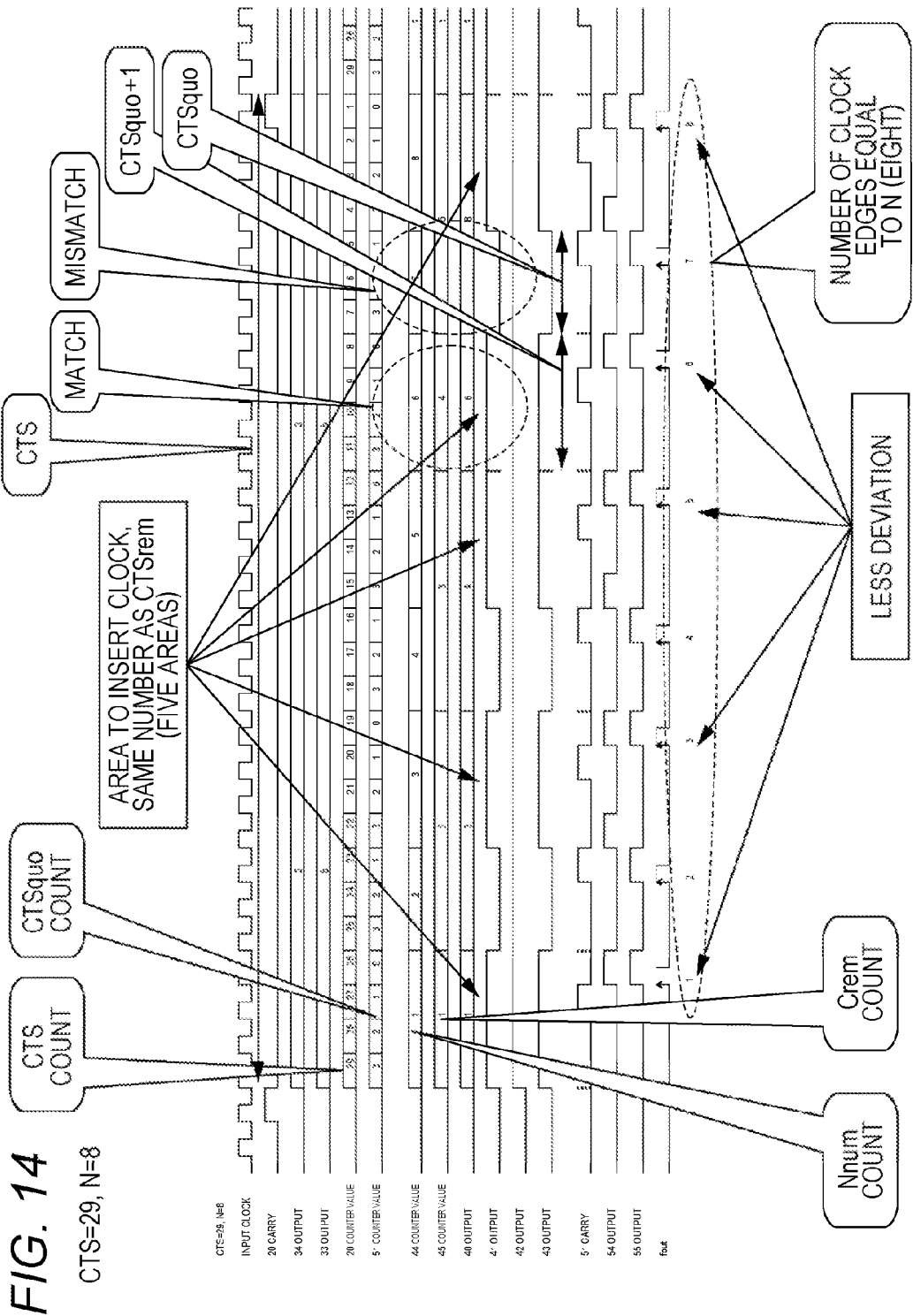
FIG. 14 is a time chart when CTS=29 and N=8 (when CTS/N leaves a remainder, and the remainder is approximately a half of N).

An example of the time chart in the case where different values are assigned for CTS and N in the present fractional frequency divider circuit is described with reference to FIG. 9 to FIG. 14. These time charts are just examples for helping the understanding. Any integer is applicable as the values of CTS and N. In the time charts of FIG. 9 to FIG. 14, the values of CTS and N are set as below. FIG. 9 is a time chart when CTS=7 and N=7. FIG. 10 is a time chart when CTS=12 and N=4 (when CTS is divisible by N). FIG. 11 is a time chart when CTS=11 and N=3 (when CTS/N leaves a remainder which is simple). FIG. 12 is a time chart when CTS=22 and N=6 (when CTS/N leaves a remainder). FIG. 13 is a time chart when CTS=13 and N=7 (when CTS/N leaves the maximum remainder). FIG. 14 is a time chart when CTS=29 and N=8 (when CTS/N leaves a remainder, and the remainder is approximately a half of N). As is clear from the time charts of FIG. 9 to FIG. 14, the present fractional frequency divider circuit can operate as desired regardless of the presence or absence or the remainder.

FIG. 14 includes remarks to help the understanding of this embodiment. In the time chart illustrated in FIG. 14, as aforementioned, CTS=29 and N=8. In this case, CTSquo=INT (CTS/N)=3 and CTSrem=MOD(CTS, N)=5. The cycle of fout is 3 or 4. There are five areas of CTSquo+1 to which one clock of fclk is added. In FIG. 14, the quotient of CTS/N=3 is latched in 34 output. In 33 output, the remainder of CTS/N=5 is latched. The 20 counter value is counted down from CTS=29. When the count value becomes 1, the 20 carry becomes 1. When the 20 carry becomes 1, the up counter for fout clock 44 and the up counter for CTSrem count 45 load 1, and thereby 44 counter value (Nnum counter) and 45 counter value (Crem counter) becomes 1. The 44 counter value is counted up when 55 output (selector) outputs 1. When the 55 output (selector) is 1 and the product of the 43 output is 1, the 45 counter value is counted up. When the integer multiple of N/CTSrem (40 output) matches the 44 counter value, the 43 output outputs 1; when the two do not match, the 43 output outputs 0. When the 43 output is 1, the clock is added and the cycle becomes CTSquo+1. When the 43 output is 0, the cycle becomes CTSquo by the output of the 51 carry. By gating the input clock with the product of the AND circuit 60, the clock is output to fout. As a result, the following 1 to 4 are achieved:
1. clock edge number N=8;
2. CTSrem=5 is distributed and CTSquo+1 is created;
3. since the cycle is CTSquo=3 or CTSquo+1=4, the variation is suppressed to be less than or equal to one cycle of the input clock; and
4. CTSquo+1 is disposed with smaller deviation.

The present fractional frequency divider circuit has been described in detail. However, the above description is just an example of the present disclosure in any point and does not limit the scope of the present disclosure. Needless to say, various modifications and improvements can be made without departing from the scope of the present disclosure.

The present disclosure is industrially applicable with regard to the fractional frequency divider circuit. The carry of the down counter for CTS count (second frequency divider circuit) 20 is the timing at which the values of N, CTSrem, and CTSquo are latched. As illustrated in FIG. 14, the data are latched in the 20 carry. Therefore, the down counter for CTS count 20 is to decide the condition of the signal input, and is not directly related to the output clock. N and CTS of HDMI are transferred over the packet. The values extracted from the packet are not necessarily changed at 1/CTS*fclk. If the input clock is directly processed without providing the latch circuits 32, 33, and 34, the values may change during the calculation. Therefore, the down counter for CTS count (second frequency divider circuit) 20 decides the timing to latch by counting 1/CTS. Therefore, when the N and CTS to be input change at the cycle like the 34 output or 33 output illustrated in FIG. 14, the down counter for CTS count (second frequency divider circuit) 20 may be omitted. The down counter for CTS count 20 resets the down counter for fout cycle (first frequency divider circuit) 51 by the OR circuit 50. In the general operation, however, the output of the down counter for CTS count 20 matches the signal of the selector 55. If there is no illegal operation, the down counter for CTS count (second frequency divider circuit) 20 may be omitted with regard to the reset. The fractional frequency divider circuit according to the present disclosure can be expressed as any of the following first and second fractional frequency divider circuits.

A first fractional frequency divider circuit is a fractional frequency divider circuit that can output the output clock obtained by frequency-dividing the input clock at N/CTS, which is the ratio of the integer N to the integer CTS, and includes: a second frequency divider circuit that frequency-divides the input clock at 1/CTS; a first frequency divider circuit that frequency-divides the input clock at 1/CTSquo, the CTSquo representing the quotient of CTS/N; a clock addition circuit that adds one clock to the output of the first frequency divider circuit; a counter that counts the number of cycles of the output of the first frequency divider circuit by the carry of the first frequency divider circuit or the output of the clock addition circuit; a match detection circuit that determines whether the integer multiple of N/CTSrem and as value of the counter match or not, the N/CTSrem representing a remainder of CTS/N; and a selector circuit that outputs as the output clock, the output of the clock addition circuit when the match is detected by the match detection circuit and that outputs as the output clock, the output of the first frequency divider circuit when the match is not detected.

A second fractional frequency divider circuit is a fractional frequency divider circuit that can output the output clock obtained by frequency-dividing the input clock at N/CTS, which is the ratio of the integer N to the integer CTS, and executes: frequency-dividing the input clock at 1/CTS; counting the number of cycles of CTSquo in the CTS clock frequency-divided at 1/CTS, the CTSquo representing the quotient of CTS/N; and outputting the clock with a cycle of CTSquo+1 when the count value matches the integer multiple of N/CTSrem and outputting the clock with a cycle of CTSquo when the count value does not match the integer multiple thereof, the N/CTSrem representing a remainder of CTS/N.

In the first or second fractional frequency divider circuit, the clock may be output to varying CTS and N at any time.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:
1. A fractional frequency divider circuit comprising:
a first frequency divider circuit configured to frequency-divide an input clock at 1/CTSquo, wherein the CTSquo is a quotient of CTS/N (each of N and CTS is an integer);
a clock addition circuit configured to add one clock to an output of the first frequency divider circuit;
a counter that counts the number of cycles of the output of the first frequency divider circuit by a carry of the first frequency divider circuit or an output of the clock addition circuit;
a match detection circuit that determines whether an integer multiple of N/CTSrem matches a value of the counter, wherein the CTSrem is a remainder of CTS/N; and
a selector circuit that outputs the output of the clock addition circuit as an output clock when the match is detected by the match detection circuit, and outputs the output of the first frequency divider circuit as an output clock when the match is not detected.

2. The fractional frequency divider circuit according to claim 1, further comprising a second frequency divider circuit it configured to generate a CTS clock by frequency-dividing the input clock at 1/CTS, wherein:
the first frequency divider circuit is configured to use CTSquo latched according to the CTS clock; and
the match detection circuit is configured to use N and CTSrem latched according to the CTS clock.

3. The fractional frequency divider circuit according to claim 1, wherein the output clock is output at any time according to varying CTS and N.

4. A fractional frequency divider circuit configured to
generate a CTS clock by frequency-dividing an input clock at 1/CTS (CTS is an integer),
count the number of cycles of CTSquo in the CTS clock, wherein the CTSquo is a quotient of CTS/N (N is an integer), and
output a clock with a cycle of CTSquo+1 when a count value of the count matches an integer multiple of N/CTSrem and output a clock with a cycle of CTSquo when the count value of the count does not match the integer multiple of N/CTSrem, wherein the CTSrem is a remainder of CTS/N.

5. The fractional frequency divider circuit according to claim 4, further configured to output the output clock at any time according to varying CTS and N.

* * * * *